United States Patent [19]

Tanaka et al.

[11] Patent Number: 4,558,460
[45] Date of Patent: Dec. 10, 1985

[54] AUDIO APPARATUS FOR VEHICLE

[75] Inventors: Shuji Tanaka, Saitama; Shigehira Nakamura, Tokyo; Tuneaki Sakamoto, Shiki; Yoshiaki Hirakata; Tetsuo Yamagata, both of Tokyo, all of Japan

[73] Assignee: Honda Giken Kogyo Kabushiki Kaisha, Tokyo, Japan

[21] Appl. No.: 619,968

[22] Filed: Jun. 12, 1984

[30] Foreign Application Priority Data

Jun. 14, 1983 [JP] Japan ................................ 58-104892

[51] Int. Cl.⁴ ............................................. H03G 3/32
[52] U.S. Cl. ..................................... 381/86; 381/57; 455/238
[58] Field of Search ................... 381/86, 57, 104, 107; 455/238; 324/174

[56] References Cited

U.S. PATENT DOCUMENTS 2,973,432 2/1961 Hill ...................................... 455/238
3,233,178 2/1966 Byles ................................... 455/238
3,708,750 1/1973 Bucks et al. ..................... 324/174 X

FOREIGN PATENT DOCUMENTS 55-140158 1/1980 Japan ................................ 324/174
658105 10/1951 United Kingdom ................ 455/238

Primary Examiner—James L. Dwyer
Attorney, Agent, or Firm—Armstrong, Nikaido, Marmelstein & Kubovcik

[57] ABSTRACT

An audio apparatus for a vehicle is disclosed having an audio signal generator, an amplifier operatively connected to the generator for amplifying an audio signal received from the generator, a speaker for emitting sounds and which is driven by the amplifier, a vehicle speed detector, and a gain control operatively connected to the speed detector for generating a control signal and providing it to the amplifier, such that the control signal increases the gain of the amplifier according to an increase in the output of the vehicle speed detector.

11 Claims, 11 Drawing Figures

Time

AUDIO APPARATUS FOR VEHICLE

BACKGROUND OF THE INVENTION

This invention relates to an audio apparatus such as a radio or the like mounted on a vehicle such as a motorcar, a motorcycle, or the like.

The use of such an audio apparatus mounted on a vehicle becomes increasingly difficult with the increase in speed due to driving noises. Because driving noises, which are partially composed of wind noise, increase as the vehicle speed increases the sound volume of an audio apparatus previously set, at the time of a lower vehicle speed is overcome by the driving noises, if the sound volume adjusting knob of the audio apparatus is not adjusted. Accordingly, the sound volume is increased by adjusting the volume knob of the audio apparatus by the operator, but this is inconvenient because the manual adjustment must be made every time the vehicle speed is changed.

In addition, in a previously known apparatus, noise in a vehicle is detected and the volume of the audio apparatus is automatically increased or decreased according to the amount of detected noise. This type of apparatus, however, is inconvenient because it is complex in construction and high in price. It requires a microphone for detecting the amount of noise and a filter circuit for discriminating between noise and sound emitted from the

SUMMARY OF THE INVENTION

This invention has for its object to provide an apparatus which overcomes the foregoing inconveniences.

In general, noise generated around a vehicle is mostly related to a vehicle's speed. As for factors other than the vehicle speed, some driving noises are generated by nearby vehicles and some noises come from road surface conditions, including rainy weather, however, these other factors are not encountered as frequently as speed derived noise from one's own vehicle.

The instant invention has been made in consideration of these factors. In an autio apparatus for a vehicle, the same comprises an audio signal generating means, an amplification means for amplifying an audio signal from the audio signal generating means, and a sound emitting means driven by an output of the amplification means. The audio apparatus is provided with a vehicle speed detecting means and a gain control means, for generating a control signal for the amplification means, that serves to increase the gain of the amplification means according to an increase in the output of the vehicle speed detecting means.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF THE PREFERRED EMBODIMENT

A preferred embodiment of the instant invention will now be explained with reference to the above described drawings.

Figure 1:
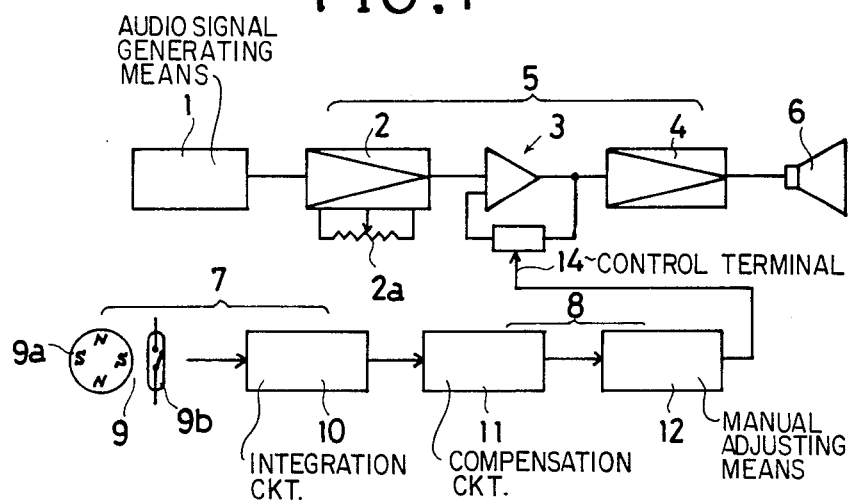
FIG. 1 is a block diagram of an embodiment of the apparatus of the instant invention.
Figure 2:
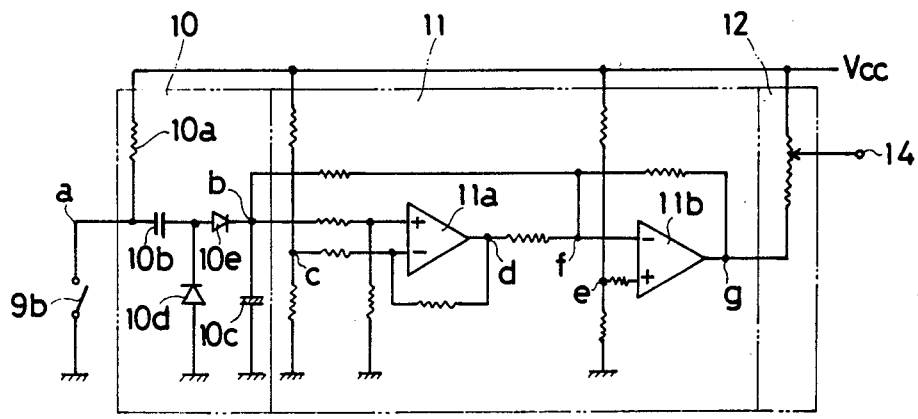
FIG. 2 is a circuit diagram of a portion of the instant invention.

Referring to FIGS. 1 and 2, numeral 1 denotes an audio signal generating means of a radio, a tape recorder or the like, constituting an audio signal generating section. The audio signal generating means 1 is connected, through an amplification means 5 to a sound emitting means 6. Amplification means 5 comprises an amplifier 2 adjustable in gain by a main variable resistance 2a, a gain control amplifier 3 adjustable in gain by a control signal and a power amplifier 4. Sound emitting means 6 is a loud speaker or the like arranged to be driven by the output from amplification means 5.

An audio apparatus of the above described construction is not especially different from a conventional model.

According to the instant invention, the audio apparatus is provided with vehicle speed detecting means 7, and gain control means 8 for generating such a control signal. The control signal is received by the amplification means 5 and serves to increase the gain of the amplification means 5 accordingly as the output of the vehicle speed detecting means 7 is increased.

In the illustrated example, the vehicle speed detecting means 7 comprises a vehicle speed pulse generating means 9 and an integration circuit 10. The gain control means 8 comprises a compensation circuit 11 for compensating the gain characteristic of the amplification means 5 in relation to vehicle speed, and a manual adjusting means 12 for adjusting an increasing rate of the gain in relation to the vehicle speed.

Figure 3A:
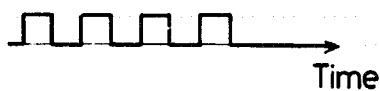
FIG. 3(A) is a diagram showing a signal wave form obtained at terminal a of FIG. 2.
Figure 3B:
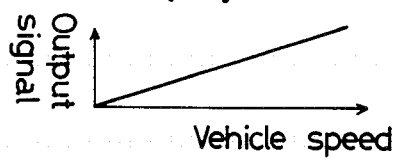
FIG. 3(B) is a diagram showibng an output signal obtained at terminal b of FIG. 2.

More in detail, the vehicle speed pulse generating means 9 of vehicle speed detecting means 7 comprises a magnet 9a provided on a wheel axle, for instance, and a reed switch 9b arranged to be opened and closed in accordance with the turning of magnet 9a. The integration circuit 10 thereof comprises a resistor 10a, capacitors 10b, 10c and diodes 10d, 10e. The vehicle speed pulses (FIG. 3(A) are generated at terminal a by the opening and closing of reed switch 9b in accordance with the vehicle speed. The speed pulses are then integrated, and consequently an output voltage characteristic (FIG. 3(B) increased linearly in accordance with vehicle speed is generated at output terminal b.

Compensation circuit 11 is a circuit for compensating an output characteristic of the integration circuit 10 in relation to vehicle speed. Thus, an output characteristic having a proper sound volume is obtained in relation to the vehicle speed as shown by a curve $Y_1$ in FIG. 5. Namely, the compensation is such that, below an extremely low speed $V_1$, that is, below 10 Km/hour, for instance, the sound volume is kept constant because any change thereof in accordance with the vehicle speed is unnecessary. In a vehicle speed range from the extremely low speed $V_1$ to a speed $V_2$, a control signal (the output from circuit 11) is decreased at a predetermined rate in relation to the vehicle speed so as to increase the sound volume. At a predetermined speed of above the speed $V_2$, for instance, the driving noise chiefly composed of the wind noise is suddenly increased, and therefore in order that the sound volume may be so increased as to cope therewith, the control signal output from circuit 11 is decreased at a larger rate than the decreasing rate in the speed range of from the speed $V_1$ to the speed $V_2$.

Figure 3C:
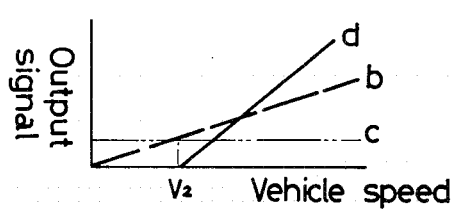
FIG. 3(C) is a diagram showing an output signal obtained at terminal d of FIG. 2.

Circuit 11 comprises two stages of operational amplifiers 11a, 11b, for instance, and the first stage operational amplifier 11a is connected at its non-inverting input terminal to output terminal b of the integration circuit 10 and is connected at its inverting input terminal to output terminal c of a divided voltage of a power source voltage $V_{cc}$. The respective terminals b and c may be applied with respective voltages shown by lines b and c in FIG. 3(C). Thus, at output terminal d, an output voltage characteristic is generated as shown by a line d in FIG. 3(C).

Figure 3D:
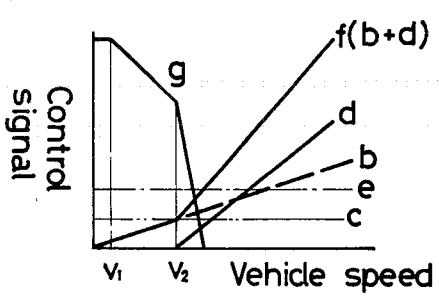
FIG. 3(D) is a diagram showing a control signal obtained at a terminal g of FIG. 2.

The second stage operational amplifier 11b is connected at its inverting input terminal to output terminal f for an addition voltage of the output voltage of terminal b and the output voltage of terminal d. Amplifier 11b is connected at its non-inverting input terminal to output terminal c of a divided voltage of the power source voltage $V_{cc}$ so that the respective terminals f and e may be applied with respective voltages shown by lines f and e in FIG. 3(D). Therefore, at output terminal g an output voltage characteristic is generated including a part saturated at the extremely low speed range as shown by curve g in FIG. 3(D).

The manual adjusting means 12 is an attenuator composed of a variable resistor, for instance, so that the output thereof may be applied to control terminal 14 of amplification means 5.

Figure 4:
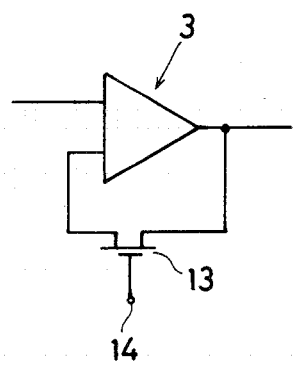
FIG. 4 is a circuit diagram of a gain control amplifier.

The gain control amplifier 3 of amplification means 5 includes a field effect transistor 13 interposed in the negative feedback circuit shown in FIG. 4. When such an output voltage of attenuator 12 which is applied to a control terminal 14 connected to a control electrode of the transistor 13 is decreased, transistor 13 may have increased in its internal resistance, resulting in a decrease in its negative feedback amount and thus an increase in its gain.

Figure 3E:
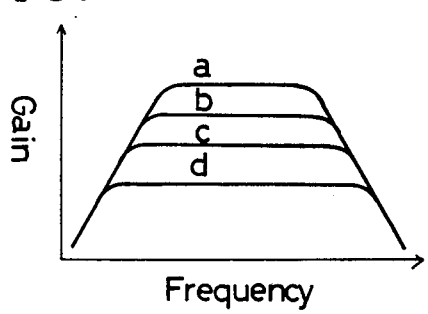
FIG. 3(E) is a diagram showing frequency-gain characteristics of a gain control amplifier.

FIG. 3(E) shows a change in frequency-gain characteristics of the gain control amplifier 3 obtained in accordance with an increase of the output voltage of the attenuator 12, that is, an increase (a d) of the feedback amount caused by lowering the internal resistance of the transistor 13. Thus, accordingly as the feedback amount is increased and thereby the sound volume is decreased, the flat part of the frequency-gain characteristic curve becomes wider, and accordingly as the feedback amount is decreased and thereby the sound volume is increased, the sound volume levels in the high frequency band and at the low frequency band are lowered.

Next, the operation of the foregoing embodiment of this invention will be explained as follows:

First, the sound volume of the speaker 6 is set to be a proper one by adjusting main variable resistor 2a in accordance with the condition of vehicles on the road, weather conditions, etc. Then, the vehicle speed is increased. If the vehicle speed is below the extremely low speed $V_1$ of 10 Km/hr., for instance, the control signal from the compensation circuit 11 is kept constant even if the vehicle speed is changed, so that the sound volume remains unchanged as shown on the left side in FIG. 5. If the vehicle speed is increased to that above the speed $V_1$ but below the speed $V_2$, the noise is increased in proportion thereto, but the control signal is decreased by the compensation circuit 11 as shown by the curve g in FIG. 3(D). Thereby the gain of gain control amplifier 3 through attenuator 12 is increased. Thus the sound volume is so increased as to cope with the increased noise. If the vehicle speed is increased to that above the speed $V_2$, the noise, chiefly composed of wind noise, is suddenly increased and consequently the increasing rate of the noise in relation to the increase in the vehicle speed is more rapid. However, in this case, the control signal from the compensation circuit 11 is rapidly decreased, and thereby the gain of gain control amplifier 3 is rapidly increased, and thus the sound volume is so increased as to cope with the increased noise. Thus, even if the vehicle speed is increased and the noise is increased in proportion thereto, the sound volume of the audio apparatus can be automatically adjusted to that of a nearly proper level suitable for easy listening.

Figure 5:
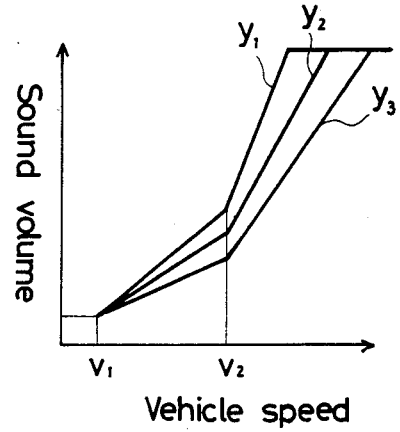
FIG. 5 is a diagram showing sound volume characteristics in relation to vehicle speed.

When the mechanical condition of a vehicle changes, for example, when the tires become worn and thereby the rate of the noise increase in relation to the vehicle speed is smaller, the variable resistance of the attenuator serving as the manual adjusting means 12 is adjusted, in the extremely low vehicle speed range, to emit a proper sound from loudspeaker 6. Curves $Y_2$, $Y_3$ in FIG. 5 show volume characteristics in relation to the vehicle speed obtained when the attenuator 12 is adjusted.

Figure 6:
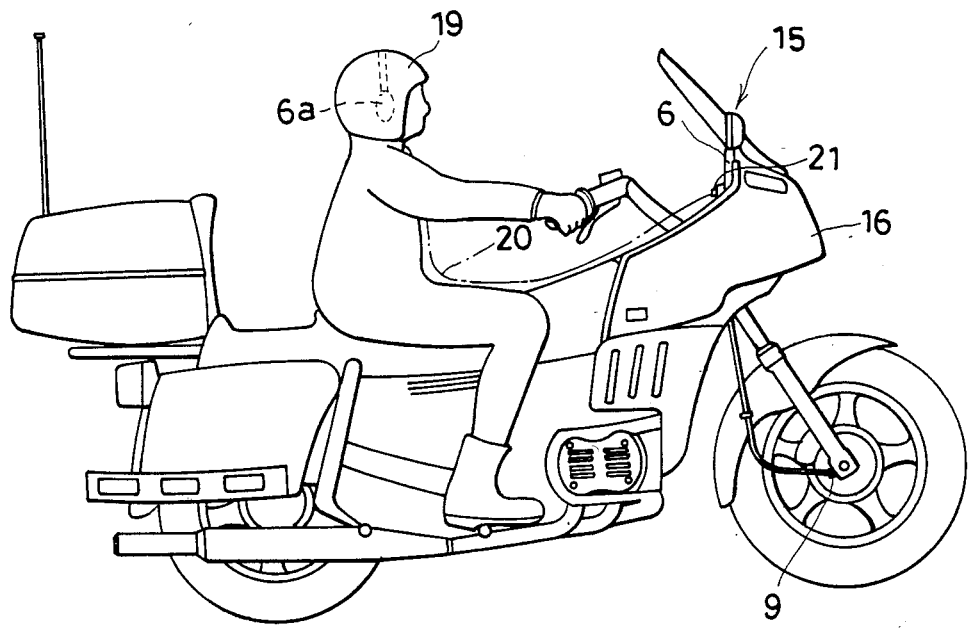
FIG. 6 is an elevational view of an embodiment of the instant invention in which it is installed in a motorcycle.
Figure 7:
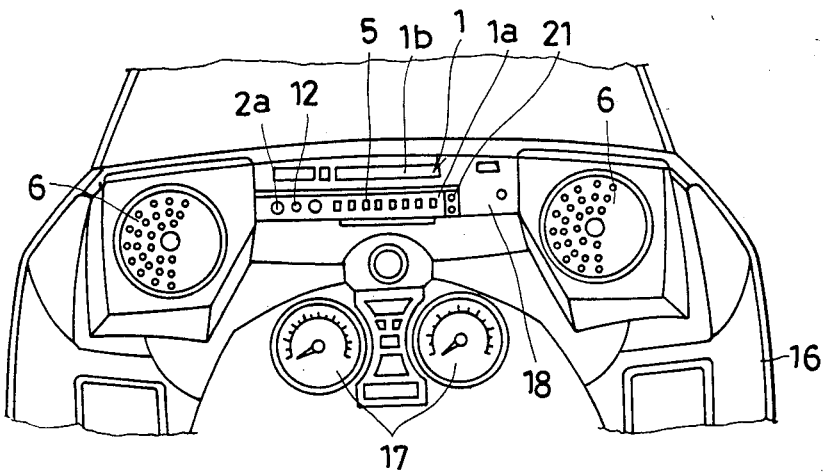
FIG. 7 is a view of the instrument panel of the motorcycle of FIG. 6.

FIGS. 6 and 7 show the apparatus of the instant invention installed in a motorcycle. As seen in FIG. 6, sound emitting means 6 can be mounted on the instrument panel or front fairing. The pulse generating means 9 is attached to the front wheel hub to provide vehicle speed data. FIG. 7 shows a view of the instrument panel in which speakers or sound emitting means are disposed on opposite sides thereof. Also shown are attenuator 12 and main variable resistance 2a.

More in detail, numeral 15 denotes a motorized two-wheeled vehicle, and the same is provided with a front fairing 16 in front of a metering 17, and the audio signal generating means 1 comprising a radio 1a and a tape recorder 1b and the amplification means 5 are mounted in an instrument panel 18 provided in the front fairing 16 so that the output thereof may reach the driver's hearing sense through the speakers 6 disposed at the right and left portions of the fairing 16 or through a headset 6a which is provided in a helmet 19 and connected through a code 20 to a connection plug 21.

Thus, according to the instant invention, an audio apparatus for a vehicle is provided with a vehicle speed detecting means and a gain control means for increasing the gain of an amplification means according to the increase in the output of the detecting means, so that a proper sound volume corresponding to a vehicle speed can be automatically obtained and the foregoing inconveniences with the conventional examples can be overcome. Thus, the apparatus is simple in construction and low in price.

It is readily apparent that the above-described audio apparatus meets all of the objects mentioned above and also has the advantage of wide commercial utility. It should be understood that the specific form of the invention hereinabove described is intended to be representative only, as certain modification within the scope of these teachings will be apparent to those skilled in the art.

Accordingly, reference should be made to the following claims in determining the full scope of the invention.

We claim:

1. An audio apparatus for a vehicle, comprising:
   means for generating an audio signal;
   amplifying means operatively connected to said generating means for amplifying an audio signal received from said generating means;
   sound emitting means for emitting sounds and which is driven by said amplifying means;
   means for detecting vehicle speed; and
   gain control means operatively connected to said speed detecting means for generating a control signal and providing it to said amplifying means, such that said control signal increases the gain of the amplifying means according to an increase in the output of said speed detecting means, wherein the output of said amplifying means, or the sound volume, is kept constant if the vehicle speed is below speed $V_1$ where $V_1$ is a predetermined, extremely low speed, and the output of said amplifying means is increased as the vehicle speed is increased above $V_1$, and wherein said output of said amplifying means increases at a faster rate when the vehicle speed is above $V_2$ than when it is below $V_2$ where $V_2$ is a predetermined vehicle speed faster than $V_1$ and above which the wind noise greatly increases.

2. The audio apparatus of claim 1, wherein said vehicle speed detecting means comprises means for generating vehicle speed pulses, and an integration circuit.

3. The audio apparatus of claim 1, wherein said gain control means comprises compensation circuit means for compensating gain characteristics of said amplifying means in relation to vehicle speed.

4. The audio apparatus of claim 1, wherein said gain control means has a manual adjusting means for adjusting the output of said gain control means.

5. The audio apparatus of claim 1, wherein said amplifying means comprises an amplifier adjustable in gain by a variable resistance, a gain control amplifier adjustable in gain by said control signal, and a power amplifier.

6. The audio apparatus of claim 2, wherein said vehicle speed pulse generating means comprises a magnet disposed on a wheel axle of the vehicle and a reed switch located promixal to said magnet, such that the rotation of the magnet causes said reed switch to be opened and closed.

7. The audio apparatus of claim 6, wherein said integration circuit comprises a resistance, capacitors and diodes.

8. The audio apparatus of claim 3, wherein said compensation circuit means comprises a first stage operational amplifier and a second stage operational amplifier.

9. The audio apparatus of claim 4, wherein said manual adjusting means is a variable resistor.

10. The audio apparatus of claim 4, wherein said gain control amplifier includes a negative feedback amplifier having a field effect transistor interposed in the negative feedback circuit thereof.

11. The audio apparatus of claim 4, wherein, when the output of said amplification means is increased, the output levels of the high and low bands of the sound volume are attenuated.

* * * * *